United States Patent [19]
Brocklesby et al.

[11] Patent Number: 6,058,579
[45] Date of Patent: May 9, 2000

[54] SNAP LATCH INSERTION/REMOVAL LEVER

[75] Inventors: Brandon Joel Brocklesby, Cedar Park; Steven Michael Christensen, Leander; Ronald Armand Roy, Austin, all of Tex.

[73] Assignee: International Business Machines Corporation, Armonk, N.Y.

[21] Appl. No.: 09/282,013

[22] Filed: Mar. 29, 1999

[51] Int. Cl.[7] .............................. A44B 21/00; G09G 3/00; H05K 7/00

[52] U.S. Cl. ................................. 24/459; 24/458; 24/522; 340/711; 361/704

[58] Field of Search ............................ 24/458, 459, 522, 24/532, 539, 540, 530, 572

[56] References Cited

U.S. PATENT DOCUMENTS

| | | | |
|---|---|---|---|
| 4,978,949 | 12/1990 | Herron et al. | 340/711 |
| 5,331,580 | 7/1994 | Miller et al. | 364/708.1 |
| 5,448,449 | 9/1995 | Bright et al. | 361/704 |
| 5,600,540 | 2/1997 | Blomquist | 361/704 |
| 5,638,258 | 6/1997 | Lin | 361/704 |
| 5,684,676 | 11/1997 | Lin | 361/704 |
| 5,831,829 | 11/1998 | Lin | 24/458 |
| 5,860,195 | 1/1999 | Wang | 24/459 |

*Primary Examiner*—Victor N. Sakran
*Attorney, Agent, or Firm*—Martin J. McKinley; Michael E. Noe; Andrew J. Dillon

[57] ABSTRACT

A snap latch device has a handle with a pair of cam members extending from a lower end. The device also has a flexible snap which protrudes from the handle. The front end of the snap has a barbed lip. The device is designed to interlock a shuttle assembly to a stationary chassis. The device is pivotally mounted to the shuttle which carries a board with connectors. The device is movable between an engaged position and a retracted position. In the engaged position, the cam members engage an end wall on the chassis and the snap inserts through and engages a hole in the shuttle. The mechanical interlock between the cam members and the end wall rigidly secures the shuttle in the chassis. The device is moved to the retracted position by pulling back on the snap to dislodge the barbed lip. This release allows the device to rotate so that the cam members disengage the end wall. After the snap and cam members are clear of the hole and end wall, respectively, the shuttle may be completely removed from the chassis. The shuttle may be inserted and locked into the chassis by reversing these steps. The snap provides visual and audible feedback to the installer to insure a proper connection between the mating connectors on the shuttle and chassis.

14 Claims, 3 Drawing Sheets

SNAP LATCH INSERTION/REMOVAL LEVER

BACKGROUND OF THE INVENTION

1. Technical Field

This invention relates in general to fasteners and in particular to a mechanical latching device which confirms alignment.

2. Background Art

Retention levers for securing an assembly to a chassis are well known. However, most positive retention levers require additional hardware such as a screw to be secured. Other retention levers use captive screws which are permanently mounted in either the assembly or chassis. Although captive screws reduce the number of parts, additional steps are required to secure the lever.

SUMMARY OF THE INVENTION

A snap latch insertion/extraction device has a handle with a pair of cam members extending from a lower end. The device also has a flexible snap feature which protrudes from the handle. The front end of the snap feature has a barbed lip. The device is designed to interlock a shuttle assembly to a stationary chassis. The device is pivotally mounted to the shuttle which carries an electronics board with connectors.

The device is movable between an engaged position and a retracted position. In the engaged position, the cam members of the device engage an end wall on the chassis and the snap feature inserts through and engages a hole in the shuttle. The mechanical interlock between the cam members and the end wall rigidly secures the shuttle in the chassis. The device is moved to the retracted position by pulling back on the snap feature to dislodge the barbed lip. This release allows the device to rotate so that the cam members disengage the end wall. After the snap feature and cam members are clear of the hole and end wall, respectively, the shuttle may be completely removed from the chassis. The shuttle may be inserted and locked into the chassis by reversing these steps. The snap feature provides visual and audible feedback to the installer to insure a proper connection between the mating connectors on the shuttle and chassis.

BEST MODE FOR CARRYING OUT THE INVENTION

Figure 4:
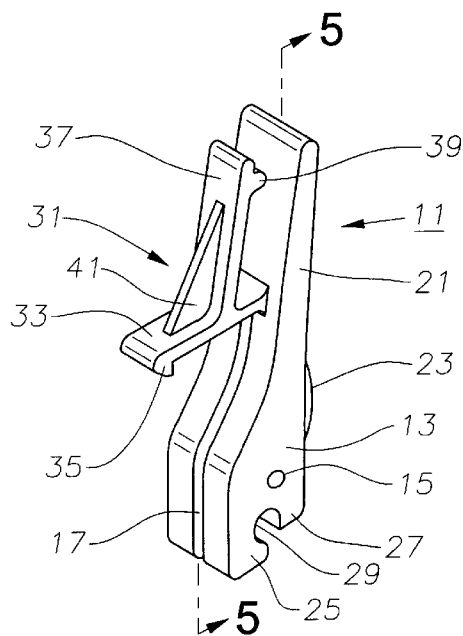
FIG. 4 is an enlarged front isometric view of the apparatus of FIG. 1.
Figure 5:
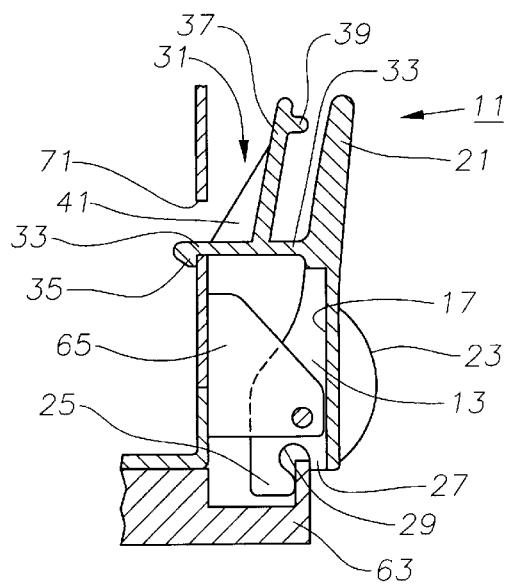
FIG. 5 is a sectional side view of the apparatus of FIG. 1 taken along the line 5—5 of FIG. 4, and is in the engaged position.

Referring to FIG. 4, a snap latch insertion/extraction lever or device 11 is shown. Device 11 may be molded from plastic or formed from other materials. Device 11 has an elongated body 13 with a transverse pivot through hole 15 located near its lower end. The lower half or thickest portion of device 11 is bisected by longitudinal slot 17 which extends below a substantially vertical handle 21 comprising the upper half of device 11. The axis of hole 15 is perpendicular to slot 17. A rounded, half-moon flange 23 protrudes rearward from the lower half of device 11. As shown in FIG. 5, flange 23 is essentially co-planar with slot 17 which extends most of the way through body 13. Two finger-like cam members 25, 27 protrude from the lower end of body 13 to define a tubular recess 29 that extends all the way through device 11.

Device 11 also has a lock or snap feature 31 which is integrally formed with device 11. As shown in FIG. 4, snap feature 31 is narrower than handle 21 and has a base portion 33 which protrudes horizontally forward from handle 21. Base portion 33 is a thin flexible member which is designed to pivot relative to body 13 and is essentially perpendicular thereto. The front end of base portion 33 has a lip 35 which tapers downward in a barb-like fashion. Snap feature 31 also has a vertical pivot lever 37 which is substantially parallel to handle 21. Pivot lever 37 extends integrally from base portion 33 and has a short stand-off 39 protruding from its rearward surface. A thin triangular reinforcement web 41 extends between base portion 33 and pivot lever 37 for preventing relative movement therebetween.

Figure 1:
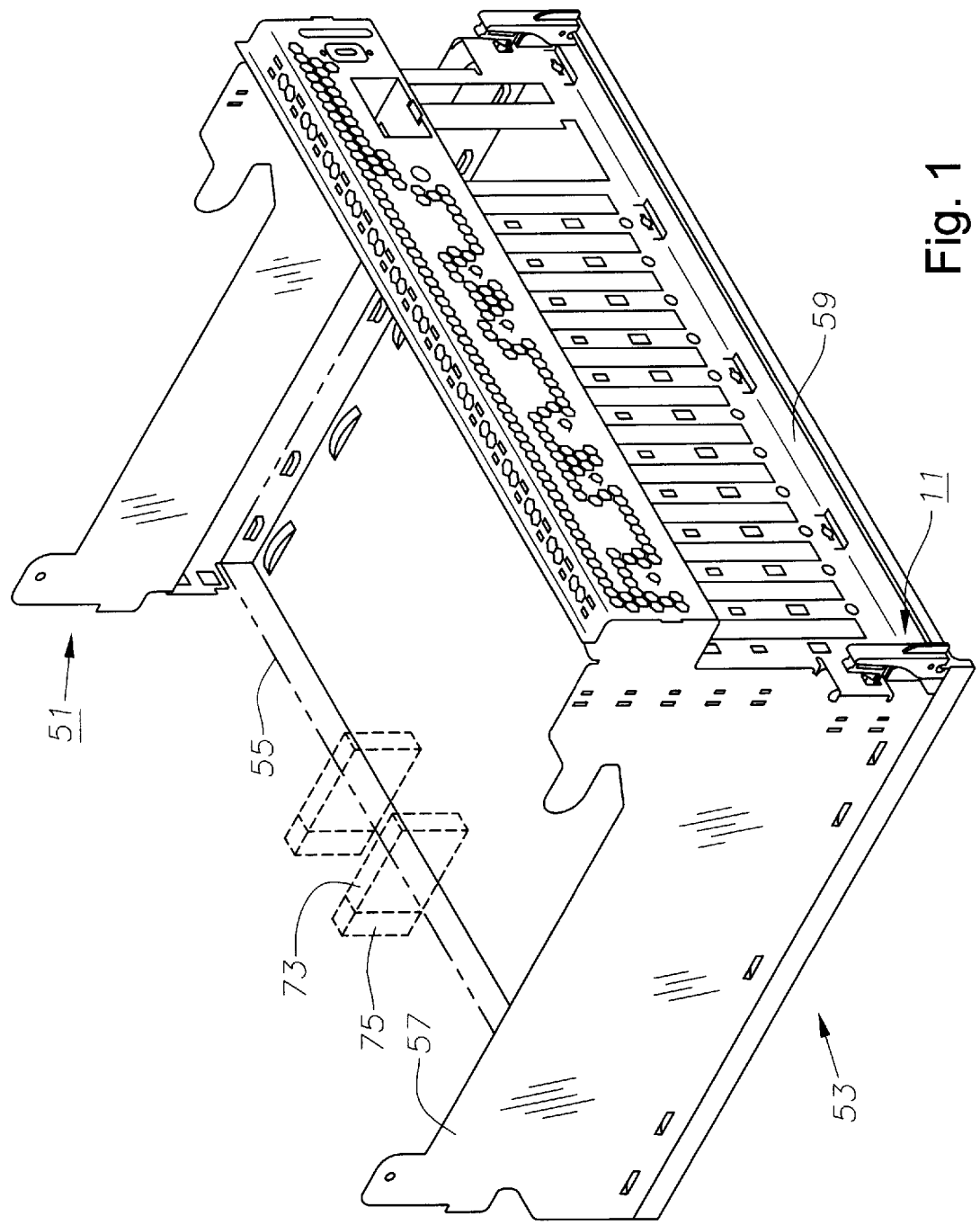
FIG. 1 is an isometric view of shuttle and chassis with a pair of latching devices which are constructed in accordance with the invention.
Figure 2:
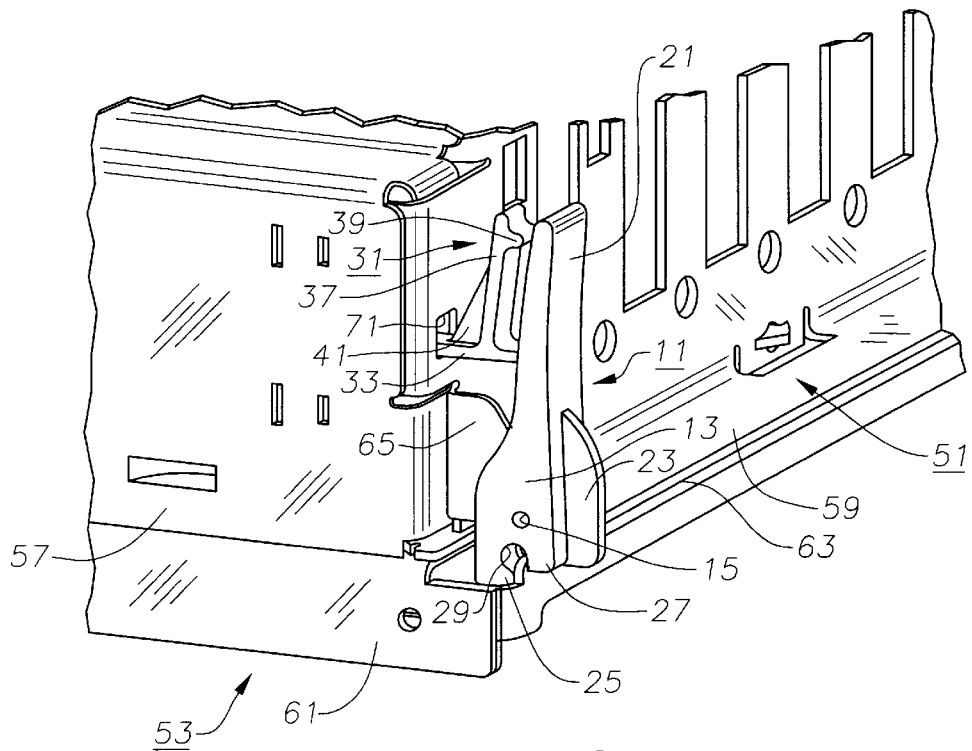
FIG. 2 is an enlarged rear isometric view of the shuttle, chassis and apparatus of FIG. 1 in an engaged position.
Figure 3:
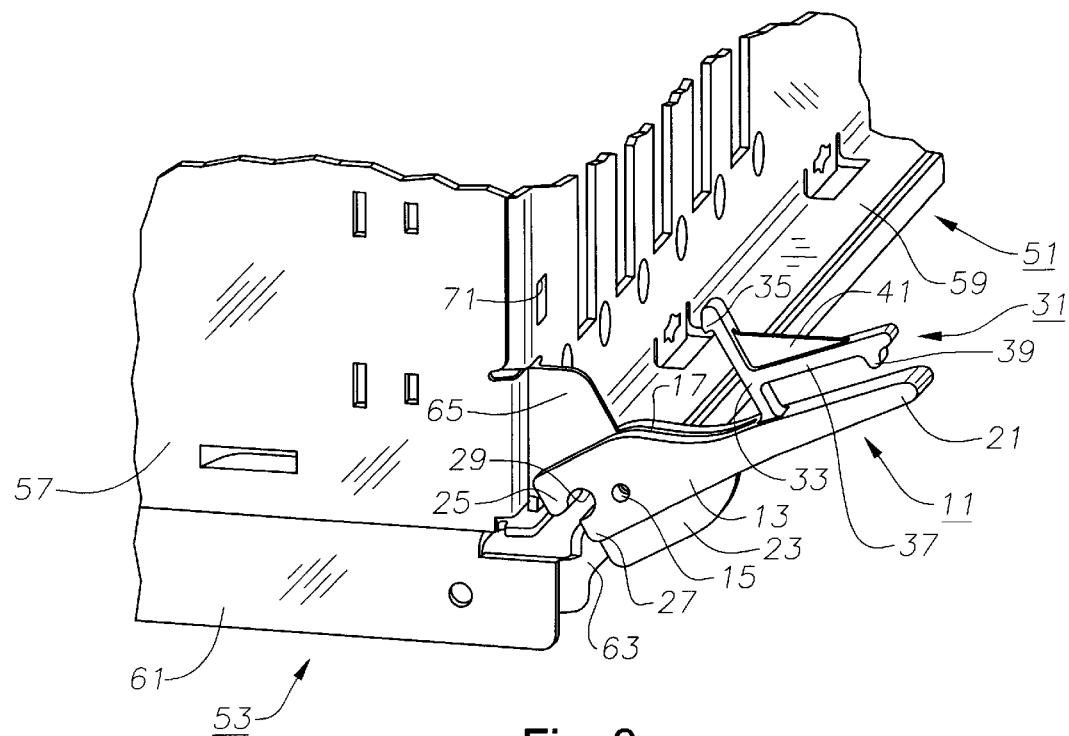
FIG. 3 is an enlarged rear isometric view of the shuttle, chassis and apparatus of FIG. 1 in an released position.

Referring now to FIGS. 1 and 2, device 11 is designed for interlocking a shuttle assembly 51 to a stationary frame or chassis 53. One device 11 is mounted to each side of shuttle assembly 51. FIGS. 1 and 2 show device(s) 11 is an upright, engaged position. In the embodiment shown, shuttle assembly 51 is provided for carrying a electronics card or board 55 (indicated schematically by dashed lines in FIG. 1). Shuttle assembly 51 and chassis 53 are formed from sheet metal. Shuttle assembly 51 has side walls 57 and an end wall 59 with portals for accommodating and/or accessing various electronic components on board 55. Chassis 53 has narrow side walls 61 and a thin end wall 63 (FIG. 2) joining side walls 61. Shuttle assembly 51 has a pair of small, triangular-shaped flanges 65 that protrude rearward from end wall 59. Flanges 65 are essentially perpendicular to end wall 59. One device 11 is pivotally mounted to each flange 65 with a small pin or fastener (not shown).

Figure 7:
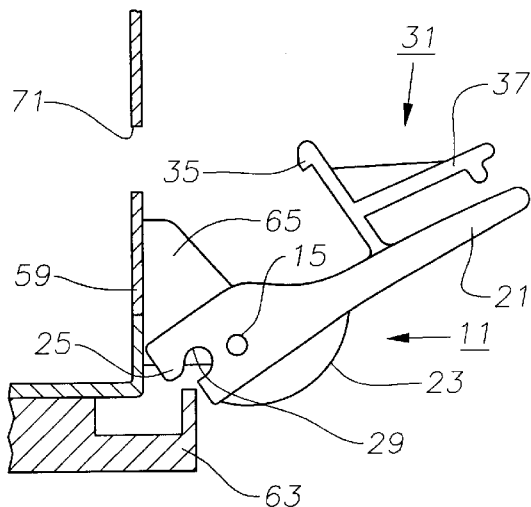
FIG. 7 is a side of the apparatus of FIG. 1 in the released position.

In operation, devices 11 are movable between an locked or engaged position (FIGS. 1, 2 and 5) and a released or retracted position (FIGS. 2 and 7). In the engaged position, body 13 of device 11 is substantially vertical and parallel to end wall 59 of shuttle assembly 51. Cam members 25, 27 surround and engage the upper edge of end wall 63 on chassis 53 such that it is firmly located in recess 29. In the engaged position, each lip 35 of snap feature 31 engages a small rectangular hole 71 in end wall 59. The mechanical interlock between cam members 25, 27 and end wall 63 rigidly secures shuttle assembly 51 in chassis 53.

Figure 6:
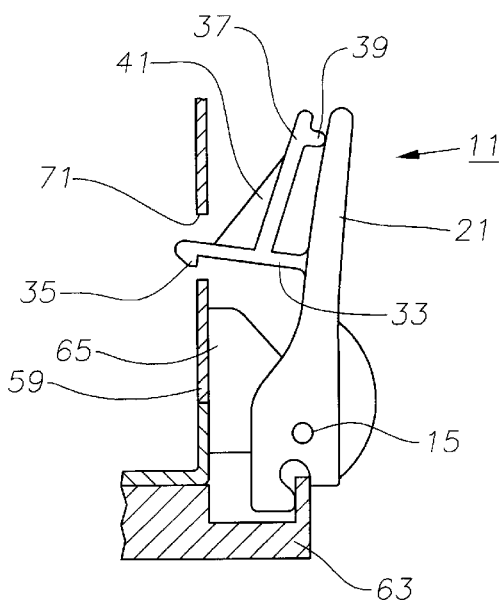
FIG. 6 is a side view of the apparatus of FIG. 1 prior to moving to the released position.

Device 11 may be moved to the retracted position by first pulling back on (to the right of FIG. 6) or pinching pivot lever 37 against handle 21. With this force, snap feature 31 is pivoted relative to handle 21 through base portion 33. Web 41 pulls lip 35 out of engagement with hole 71 until stand-off 39 contacts handle 21. Additional rearward pull or force (clockwise in FIG. 7) causes device 11 to pivot about the pin in hole 15. As device 11 rotates, it acts like a lever against the fixed end wall 63 to pull shuttle assembly 51 out (to the right) of chassis 53. After snap feature 31 and cam member 25 are clear of hole 71 and end wall 63, respectively (FIG. 7), shuttle assembly 51 may be completely removed from chassis 53.

To insert shuttle assembly 51 into chassis 53, the order of the previous steps is reversed. First, the front (left) end of shuttle assembly 51 is aligned with and inserted into the rearward opening (right) in chassis 53. As shuttle assembly 51 continues to move forward or into chassis 53, cam member 27 or flange 23 will eventually abut end wall 63 (FIG. 7). At this point, the installer pushes handles 21 forward (to the left) so that devices 11 rotate counterclockwise. As devices 11 rotate cam members 25, 27 are camming the fixed upper edge of end wall 63 into recess 29 while shuttle assembly 51 continues to move forward relative to chassis 53. Electrical board connectors 73 (indicated schematically with dashed lines in FIG. 1) on the front end of board 55 will begin to engage mating connectors 75 associated with chassis 53. As devices 11 move to the engaged position (FIGS. 6 and 5), the inclined surfaces on lips 35 will slide into holes 71 until they snap into place due to the resiliency of base portion 33. Devices 11 give the installer positive feedback by physically and audibly indicating precise alignment and engagement between connectors 73 and 75 since they are not visible to the installer. When devices 11 are locked in place, they provide assurance that connectors 73, 75 will not migrate or unintentionally disengage. Both the engagement and retraction operations are performed without the use of any additional tools.

The invention has several advantages. The device is a single piece, molded plastic part that is used for camming the assembly in and out of the chassis. The device can withstand high camming forces and "lock" the assembly in place after insertion. Unlike prior art mechanisms, this device requires no tools. The device solves the problem of providing positive feedback to the installer when the mating board connectors are fully engaged and prevents unintentional disengagement of the connectors. The cam members provided visual feedback for alignment and the snap features provide audible feedback for complete fit.

While the invention has been shown or described in only some of its forms, it should be apparent to those skilled in the art that it is not so limited, but is susceptible to various changes without departing from the scope of the invention.

We claim:

1. An apparatus, comprising in combination:
   a chassis having at least one electrical connector;
   a shuttle assembly having an electronics board with at least one electrical connector for matably engaging the electrical connector on the chassis when the shuttle assembly is plugged into the chassis;
   a latch pivotally mounted to the shuttle assembly, the latch having a handle for manual engagement, a lock and a cam member, wherein the latch is movable by manipulation of the handle between an engaged position wherein the cam member engages the chassis to secure the shuttle assembly to the chassis and the lock engages the shuttle assembly to retain the latch in the engaged position, and a released position wherein the cam member disengages the chassis and the lock moves relative to the handle to disengage the shuttle assembly; and wherein
   when the lock engages the shuttle assembly, an audible signal results which indicates compliance between the electrical connectors on the chassis and shuttle assembly.

2. The apparatus of claim 1 wherein the chassis and the shuttle assembly each have an end wall which is engaged by the cam member and the lock, respectively, as the latch moves to the engaged position.

3. The apparatus of claim 2 wherein the end wall of the shuttle assembly has a flange protruding therefrom to which the latch is pivotally mounted.

4. The apparatus of claim 1 wherein the shuttle assembly has a hole which is engaged by the lock while the latch is in the engaged position.

5. The apparatus of claim 1 wherein the latch comprises a pair of latches, one on each side of the shuttle assembly.

6. The apparatus of claim 1 wherein the lock comprises a pivot member which is integrally formed with and extends from the handle, a manually engageable lever extending from the pivot member for flexing the lock relative to the handle, and a lip on the pivot member for releasably engaging the shuttle assembly.

7. The apparatus of claim 1 wherein at least a portion of the latch is symmetrically and longitudinally bisected by a slit.

8. The apparatus of claim 1 wherein the lock engages the shuttle assembly after the cam member has engaged the chassis.

9. An apparatus, comprising in combination:
   a chassis having an end wall on a rearward end and an electrical connector on a forward end;
   a shuttle assembly having a receptacle on a rearward end, an electronics board with an electrical connector on a forward end for matably engaging the electrical connector on the chassis when the shuttle assembly is plugged into the chassis;
   a latch pivotally mounted adjacent to the rearward end of the shuttle assembly, the latch having a cam member which is movable between an engaged position wherein the cam member engages the end wall of the chassis to secure the shuttle assembly to the chassis, and a released position wherein the cam member disengages the end wall of the chassis; and
   an audible indicator mounted to the latch and having a free end with a lip which engages the receptacle in the shuttle assembly when the latch moves from the released position to the engaged position, such that the latch visually and audibly indicates compliance between the electrical connectors on the chassis and shuttle assembly.

10. The apparatus of claim 9 wherein the lip on the audible indicator engages the receptacle after the cam member has engaged the chassis.

11. The apparatus of claim 9 wherein the cam member is located on an opposite side of a pivot point of the latch than the audible indicator.

12. The apparatus of claim 9 wherein the audible indicator is a resilient elongated member extending from the latch, the free end of the audible indicator being movable relative to the latch.

13. The apparatus of claim 12, further comprising a pivot lever extending from the elongated member for manually moving the lip out of engagement with the receptacle.

14. A latch for assuring compliance between a chassis and a shuttle assembly, the chassis having an end wall on a rearward end and an electrical connector on a forward end, and the shuttle assembly having a receptacle on a rearward end, an electronics board with an electrical connector on a forward end for matably engaging the electrical connector on the chassis, the latch comprising:
   a body adapted to be pivotally mounted adjacent to the rearward end of the shuttle assembly;
   a cam member on the body which is adapted to engage the end wall of the chassis to secure the shuttle assembly to the chassis while the latch is in an engaged position;

a snap feature mounted to and extending forward from the body, the snap feature having a base portion with a lipped free end which is adapted to engage the receptacle in the shuttle assembly to retain the cam member in the engaged position, the base portion being movable relative to the body via a pivot member extending from the base portion, the pivot member being provided to move the lipped free end out of engagement with the receptacle, and wherein the snap feature is resiliently biased to the engaged position.

* * * * *